(12) United States Patent
Li et al.

(10) Patent No.: US 10,762,975 B2
(45) Date of Patent: Sep. 1, 2020

(54) SHIFT REGISTER CIRCUIT, DRIVING METHOD THEREOF, AND DISPLAY DEVICE

(71) Applicants: Beijing BOE Display Technology Co., Ltd., Beijing (CN); BOE TECHNOLOGY GROUP CO., LTD., Beijing (CN)

(72) Inventors: Feng Li, Beijing (CN); Jing Wang, Beijing (CN)

(73) Assignees: BEIJING BOE DISPLAY TECHNOLOGY CO., LTD., Beijing (CN); BOE DISPLAY TECHNOLOGY CO., LTD., Beijing (CN)

( * ) Notice: Subject to any disclaimer, the term of this patent is extended or adjusted under 35 U.S.C. 154(b) by 163 days.

(21) Appl. No.: 16/194,470

(22) Filed: Nov. 19, 2018

(65) Prior Publication Data

US 2019/0325978 A1 Oct. 24, 2019

(30) Foreign Application Priority Data

Apr. 18, 2018 (CN) .......................... 2018 1 0350029

(51) Int. Cl.
*G11C 19/00* (2006.01)
*G11C 19/28* (2006.01)
*G09G 3/20* (2006.01)
*G09G 3/36* (2006.01)

(52) U.S. Cl.
CPC ............. *G11C 19/287* (2013.01); *G09G 3/20* (2013.01); *G11C 19/28* (2013.01); *G09G 3/3677* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 2008/0002803 A1* | 1/2008 | Kim | ...................... | G09G 3/3674 377/64 |
| 2011/0102388 A1* | 5/2011 | Chin | ..................... | G09G 3/3677 345/205 |
| 2011/0316834 A1* | 12/2011 | Lee | ........................ | G09G 3/3677 345/211 |
| 2014/0354523 A1* | 12/2014 | So | ......................... | G09G 3/3677 345/100 |
| 2015/0302790 A1* | 10/2015 | Dong | ..................... | G11C 19/28 345/214 |
| 2015/0339999 A1* | 11/2015 | Zheng | .................... | G11C 19/28 345/92 |
| 2015/0379912 A1* | 12/2015 | Wen | .......................... | G09G 3/20 345/92 |
| 2018/0080973 A1* | 3/2018 | Zhang | .................... | G09G 3/006 |
| 2019/0073932 A1* | 3/2019 | Huang | ................. | G09G 3/3666 |

* cited by examiner

*Primary Examiner* — Tuan T Lam
(74) *Attorney, Agent, or Firm* — Calfee, Halter & Griswold LLP

(57) ABSTRACT

A shift register circuit including: a first switching unit, a second switching unit, a third switching unit, a fourth switching unit, a fifth switching unit, a sixth switching unit, a seventh switching unit, and an eighth switching unit.

15 Claims, 2 Drawing Sheets

SHIFT REGISTER CIRCUIT, DRIVING METHOD THEREOF, AND DISPLAY DEVICE

CROSS-REFERENCE TO RELATED APPLICATIONS

The present application claims priority to Chinese Patent Application No. 201810350029.0 filed Apr. 18, 2018, the entire contents of which are incorporated herein by reference.

TECHNICAL FIELD

The present disclosure relates to the field of display technology, and more particularly, to a shift register circuit, a driving method thereof, and a display device.

BACKGROUND

With the development of optical technology and semiconductor technology, flat panel displays represented by Liquid Crystal Displays (LCDs) and Organic Light Emitting Diodes (OLEDs) occupy the leading status in the field of display due to their characteristics such as lighting and thinness, low energy consumption, fast response speed, and high color purity and high contrast ratio. In recent years, display devices have shown a development trend of high integration and low cost. A gate drive circuit is integrated into a peripheral area of an array substrate by using a shift register unit GOA, which can effectively reduce the manufacturing cost of the display devices and improve the module process yield while achieving a narrow bezel design.

However, a commonly used bidirectional scanning shift register circuit includes a plurality of cascaded shift register units, and may fail to generate an output signal when a scanning direction is switched. Therefore, it is necessary to provide a new shift register circuit capable of bidirectional scanning It should be noted that the information disclosed in the Background section above is only for enhancing the understanding of the background of the present disclosure, and thus may include information that does not constitute prior art known to those of ordinary skill in the art.

SUMMARY

According to an aspect of the present disclosure, there is provided a shift register circuit, including N cascaded shift register units, wherein the shift register units of odd-numbered stages receive a first clock signal, and the shift register units of even-numbered stages receive a second clock signal, N is an integer and N≥4, wherein the shift register circuit further includes:

a first switching unit configured to be turned on in response to a gate drive signal, to transmit the gate drive signal to an input terminal of the shift register unit of the second stage;

a second switching unit configured to be turned on in response to an output signal of the shift register unit of the first stage, to connect an output terminal of the shift register unit of the first stage with the input terminal of the shift register unit of the second stage;

a third switching unit configured to be turned on in response to a first signal, to connect a first node with the input terminal of the shift register unit of the second stage;

a fourth switching unit configured to be turned on in response to the gate drive signal, to connect the first node with an input terminal of the shift register unit of the first stage;

a fifth switching unit configured to be turned on in response to the gate drive signal, to transmit the gate drive signal with a reset terminal of the shift register unit of the $N-1^{th}$ stage;

a sixth switching unit configured to be turned on in response to an output signal of the shift register unit of the $N^{th}$ stage, to connect an output terminal of the shift register unit of the $N^{th}$ stage with the reset terminal of the shift register unit of the $N-1^{th}$ stage;

a seventh switching unit configured to be turned on in response to a second signal, to connect a second node to the reset terminal of the shift register unit of the $N-1^{th}$ stage;

an eighth switching unit configured to be turned on in response to the gate drive signal, to connect a reset terminal of the shift register unit of the $N^{th}$ stage with the second node.

In an exemplary embodiment of the present disclosure, the first switching unit includes:

a first switching element having a control terminal and a first terminal which receive the gate drive signal, and a second terminal which is connected to the input terminal of the shift register unit of the second stage;

the second switching unit includes:

a second switching element having a control terminal and a second terminal which are connected to the output terminal of the shift register unit of the first stage, and a first terminal which is connected to the input terminal of the shift register unit of the second stage;

the third switching unit includes:

a third switching element having a control terminal which receives the first signal, a first terminal which is connected to the first node, and a second terminal which is connected to the input terminal of the shift register unit of the second stage;

the fourth switching unit includes:

a fourth switching element having a control terminal which receives the gate drive signal, a first terminal which is connected to the input terminal of the shift register unit of the first stage, and a second terminal which is connected to the first node;

the fifth switching unit includes:

a fifth switching element having a control terminal and a first terminal which receive the gate drive signal, and a second terminal which is connected to the reset terminal of the shift register unit of the $N-1^{th}$ stage;

the sixth switching unit includes:

a sixth switching element having a control terminal and a second terminal which are connected to the output terminal of the shift register unit of the $N^{th}$ stage, and a first terminal which is connected to the reset terminal of the shift register unit of the $N-1^{th}$ stage;

the seventh switching unit includes:

a seventh switching element having a control terminal which receives the second signal, a first terminal which is connected to the second node, and a second terminal which is connected to the reset terminal of the shift register unit of the $N-1^{th}$ stage;

the eighth switching unit includes:

an eighth switching element having a control terminal which receives the gate drive signal, a first terminal which is connected to the reset terminal of the shift register unit of the $N^{th}$ stage, and a second terminal which is connected to the second node.

In an exemplary embodiment of the present disclosure, the switching elements are all N-type transistors, and when a forward scan is performed on the shift register circuit, the first signal is a low level signal, and the second signal is a high level signal, and when a reverse scan is performed on the shift register circuit, the first signal is a high level signal, and the second signal is a low level signal.

In an exemplary embodiment of the present disclosure, the switching elements are all P-type transistors, and when a forward scan is performed on the shift register circuit, the first signal is a high level signal, and the second signal is a low level signal, and when a reverse scan is performed on the shift register circuit, the first signal is a low level signal, and the second signal is a high level signal.

In an exemplary embodiment of the present disclosure, the switching elements are all thin film transistors.

According to an aspect of the present disclosure, there is provided a driving method of a shift register circuit for driving any one of the shift register circuits described above, including:

when a forward scan is performed, the first switching unit is turned on by the gate drive signal, to transmit the gate drive signal to the input terminal of the shift register unit of the second stage, so that the shift register circuit starts performing the forward scan from the shift register unit of the second stage, and at the same time, the fifth switching unit and the eighth switching unit are turned on by the gate drive signal, and the seventh switching unit is turned on by the second signal, to transmit the gate drive signal to the reset terminal of the shift register unit of the $N^{th}$ stage and the reset terminal of the shift register unit of the $N-1^{th}$ stage, when scanning to the shift register unit of the $N^{th}$ stage, the sixth switching unit is turned on by the output signal of the shift register unit of the $N^{th}$ stage, to transmit the output signal to the reset terminal of the shift register unit of the $N-1^{th}$ stage; and when the forward scan is switched to a reverse scan, the first signal and the second signal are interchanged to interchange the reset terminals and the input terminals of the shift register units, and switch the first clock signal and the second clock signal, the fifth switching unit is turned on by the gate drive signal, to transmit the gate drive signal to the input terminal of the shift register unit of the $N-1^{th}$ stage, so that the shift register circuit starts performing the reverse scan from the shift register unit of the $N-1^{th}$ stage, and at the same time, the first switching unit and the fourth switching unit are turned on by the gate drive signal, the third switching unit is turned on by the first signal, to transmit the gate drive signal to the reset terminal of the shift register unit of the first stage and the reset terminal of the shift register unit of the second stage, when scanning to the shift register unit of the first stage, the second switching unit is turned on by the output signal of the shift register unit of the first stage, to transmit the output signal to the reset terminal of the shift register unit of the second stage.

In an exemplary embodiment of the present disclosure, the first switching unit to the eighth switching unit correspond to first switching element to eighth switching element, respectively.

In an exemplary embodiment of the present disclosure, the switching elements are all N-type transistors, and when the forward scan is performed, the first signal is a low level signal, and the second signal is a high level signal, and when the reverse scan is performed, the first signal is a high level signal, and the second signal is a low level signal.

In an exemplary embodiment of the present disclosure, the switching elements are all P-type transistors, and when the forward scan is performed, the first signal is a high level signal, and the second signal is a low level signal, and when the reverse scan is performed, the first signal is a low level signal, and the second signal is a high level signal.

According to an aspect of the present disclosure, there is provided a display device comprising any of the shift register circuits described above.

It should be noted that the foregoing information disclosed in Background are only for the purpose of enhancement of the understanding of the background of the present disclosure and therefore the information can include information that does not constitute the prior art already known to those of ordinary skill in the art.

BRIEF DESCRIPTION OF THE DRAWINGS

The above-described and other features and advantages of the present disclosure will become more apparent from the detailed descriptions of exemplary embodiments with reference with the accompanying drawings. Obviously, the drawings in the following description are only some embodiments of the present disclosure, and those skilled in the art can also obtain other drawings based on these drawings without any creative work. In the drawings.

DETAILED DESCRIPTION

Figure 1:
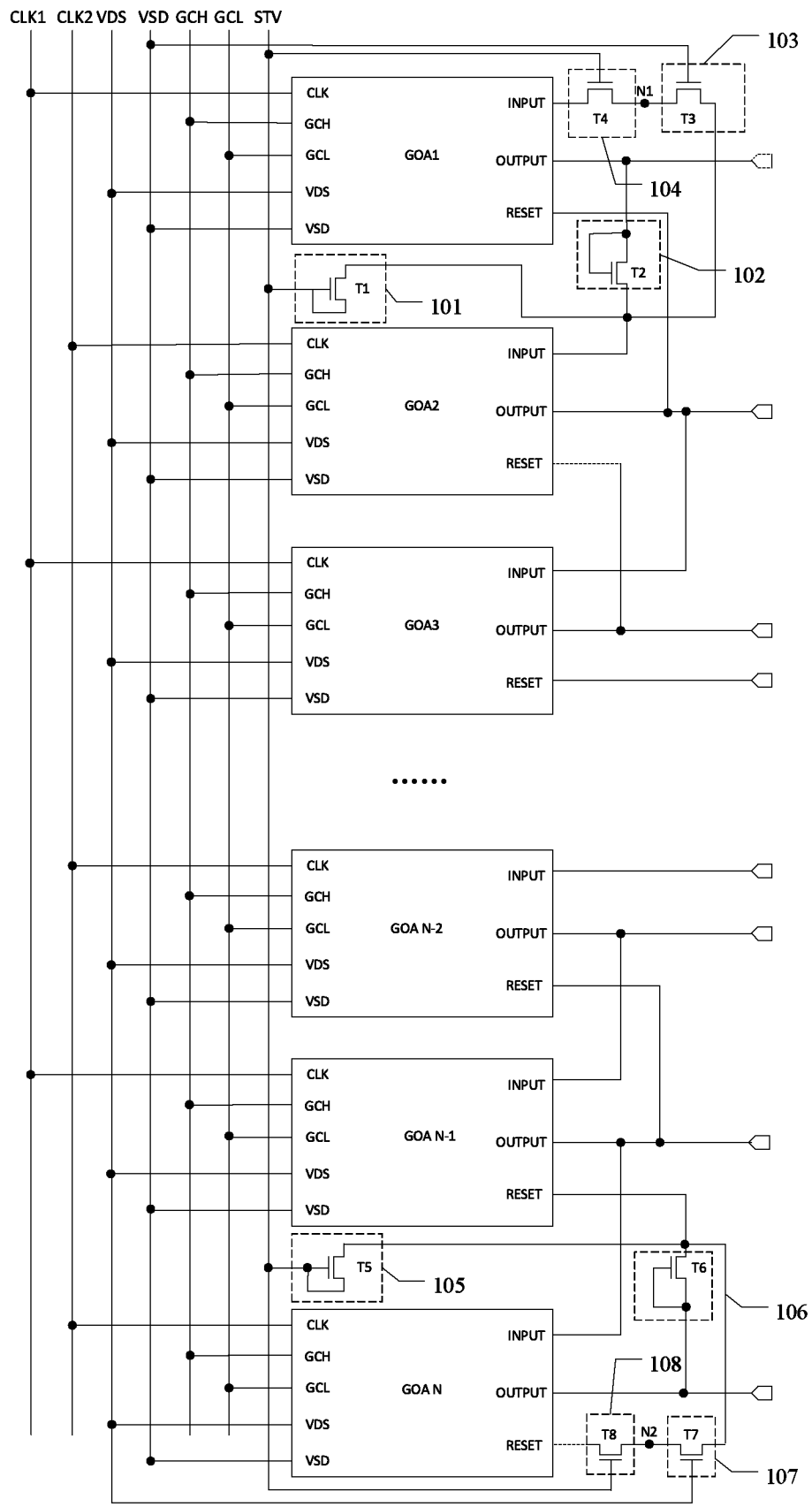
FIG. 1 is a structural schematic diagram of a shift register circuit according to the present disclosure.

The exemplary embodiments will now be described more fully with reference to the accompanying drawings. However, the exemplary embodiments can be implemented in various forms and should not be understood as being limited to the embodiments set forth herein; rather, these embodiments are provided so that the present disclosure will be thorough and complete, and the conception of exemplary embodiments will be fully conveyed to those skilled in the art. The features, structures or characteristics described herein may be combined in one or more embodiments in any suitable manner. In the following description, numerous specific details are provided so as to allow a full understanding of the embodiments of the present disclosure. However, those skilled in the art will recognize that the technical solutions of the present disclosure may be practiced without one or more of the specific details, or other methods, components, materials, devices, steps and so on may be used. In other cases, the well-known technical solutions are not shown or described in detail to avoid obscuring various aspects of the present disclosure.

In addition, the drawings are merely schematic illustrations of the present disclosure and are not necessarily drawn to scale. The same reference numerals in the drawings refer to same or similar parts, and the repeated descriptions thereof will be omitted.

Currently, a commonly used bidirectional scanning shift register circuit includes a plurality of cascaded shift register units. Descriptions will be made by taking a shift register circuit including two clock signals as an example. A connection manner of a plurality of shift register units in the shift register circuit including two clock signals is that an output terminal of the shift register unit of the $N^{th}$ stage is connected to an input terminal of the shift register unit of the $N+1^{th}$ stage, a reset terminal of the shift register unit of the $N^{th}$ stage is connected to an output terminal of the shift register unit of the $N+1^{th}$ stage, wherein N is an integer greater than zero. When a forward scan is performed, the shift register circuit starts scanning from the shift register unit of the first stage to the shift register unit of the last stage during one frame display, wherein scanning of the shift register unit of the last stage is completed, the shift register unit of the last stage needs to be reset by a gate drive signal of a next frame display. Since a pull-up node in the shift register unit of the last stage is always in a level high state during a black insertion phase (i.e., a blanking period) between two frame displays, resulting in that an offset time of the pull-up node in the shift register unit of the last stage is increased, which in turn results in a shift of a threshold voltage of a transistor connected to the pull-up node in the shift register unit of the last stage, and a low output signal of the shift register unit of the last stage. In this case, if the forward scan is switched to the reverse scan, the original shift register unit of the last stage becomes the shift register unit of the first stage, and since the output signal of the current shift register unit of the first stage (i.e., the shift register unit of the last stage during the forward scan) is low, the transmitting of the output signal by the cascaded shift register units will cause that a shift register unit of a certain stage cannot reach an enough turn-on voltage and fail to generate an output signal, which in turn leads to display abnormality. It should be noted that the same problem still exists when the reverse scan is switched to the forward scan.

Therefore, it is necessary to provide a new shift register circuit capable of bidirectional scanning, which can avoid a low output signal of the shift register unit of the last stage, which is caused by the increasing of the offset time of the pull-up node in the shift register unit of the last stage (the shift register unit of the last stage herein is the shift register unit that is scanned last in the scanning direction), a phenomenon in which after a scanning direction is switched, the shift register unit of a certain state cannot reach an enough turn-on voltage and fail to generate an output signal is avoided, and further, display abnormality is avoided.

Figure 2:
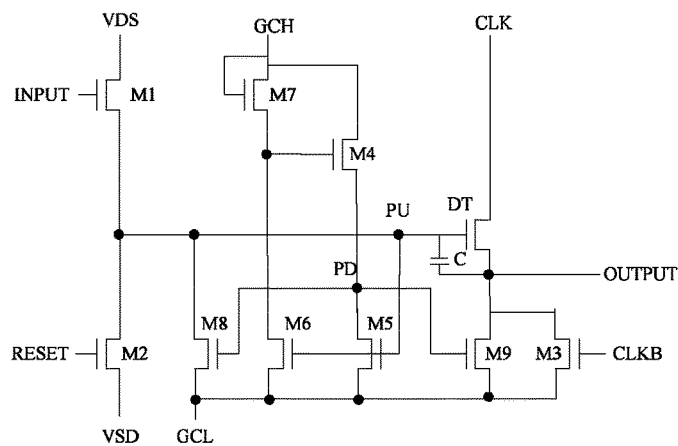
FIG. 2 is a structural schematic diagram of a shift register unit provided in an exemplary embodiment of the present disclosure.

The present exemplary embodiment provides a shift register circuit. As shown in FIG. 1, the shift register circuit may include N cascaded shift register units, wherein the shift register units of an odd-numbered stage receive a first clock signal CLK1, the shift register units of an even-numbered stage receive a second clock signal CLK2, and N is an integer and N≥4. FIG. 2 is a structural schematic diagram illustrating a shift register unit that can realize bidirectional scanning, wherein the shift register circuit includes first to ninth switching transistors M1 to M9, a driving transistor DT, and a storage capacitor C. A connection manner of the above-described components is as shown in FIG. 2, and details will not be elaborated herein. It should be noted that the first clock signal CLK1 is received by a first clock signal terminal CLK of the shift register units of the odd-numbered stage, and the second clock signal CLK2 is received by a second clock signal terminal CLKB of the shift register units of the odd-numbered stage, the second clock signal CLK2 is received by a first clock signal terminal CLK of the shift register units of the even-numbered stage, and the first clock signal CLK1 is received by the second clock signal terminal CLKB of the shift register units of the even-numbered stage.

In the following, an example is taken in which all of the switching transistors are N-type switching transistors and the driving transistor DT is an N-type driving transistor, and an operating process of the shift register unit in FIG. 2 includes the following steps.

When a forward scan is performed, a first signal VSD is at a low level, a second signal VDS is at a high level, a first reference signal GCL is at a low level, and a second reference signal GCH is at a high level. A gate drive signal STV is received at an input terminal INPUT of the shift register unit, and the gate drive signal STV is at a high level, so that the first switching transistor M1 is turned on by the gate drive signal STV, and the second signal VDS is transmitted to a pull-up node PU through the first switching transistor M1 to charge the pull-up node PU to a high level, at this time, since the pull-up node PU is at a high level, the fifth switching transistor M5 and the sixth switching transistor M6 are turned on, and the first reference signal GCL is transmitted to a pull-down node PD, to pull down the pull-down node PD, so that the eighth switching transistor M8 and the ninth switching transistor M9 are turned off, and the pull-up node PU is kept at a high level. When a clock signal is received by the first clock signal terminal CLK, an output signal is outputted through the driving transistor DT. It shall be noted that, an output signal of a shift register unit of a next stage is received by a reset terminal RESET of the shift register unit, so that the second switching transistor M2 is turned on by the output signal of the shift register unit of the next stage, and the first signal VSD is transmitted to the pull-up node PU, to pull down the pull-up node PU to a low level, meanwhile, since a phase of a scan signal received by the second clock signal terminal CLKB is the same as a phase of the output signal of the shift register unit of the next stage, which is received by the reset terminal RESET, the third switching transistor M3 is turned on, and an output terminal OUTPUT of the shift register unit is reset.

When a reverse scan is performed, the first signal VSD is at a high level, the second signal VDS is at a low level, the first reference signal GCL is at a low level, and the second reference signal GCH is at a high level, meanwhile, the first clock signal CLK1 and the second clock signal CLK2 are switched, at this time, the input terminal INPUT of the shift register unit is switched to the reset terminal, and the reset terminal RESET of the shift register unit is switched to the input terminal. The gate drive signal STV is received by the input terminal (i.e., the reset terminal RESET in FIG. 2) of the shift register unit, and the gate drive signal STV is at a high level, so that the second switching transistor M2 is turned on by the gate drive signal STV, and the first signal VSD is transmitted to the pull-up node PU through the second switching transistor M2, to charge the pull-up node PU to a high level, at this time, since the pull-up node PU is at a high level, the fifth switching transistor M5 and the sixth switching transistor M6 are turned on, and the first reference signal GCL is transmitted to the pull-down node PD, to pull down the pull-down node PD, so that the eighth switching transistor M8 and the ninth switching transistor M9 are turned off, and the pull-up node PU is kept at a high level. When a clock signal is received by the first clock signal terminal CLK, an output signal is outputted through the driving transistor DT. It shall be noted that, an output signal of a shift register unit of a next stage is received by the reset terminal of the shift register unit (i.e., the input terminal INPUT in FIG. 2), so that the first switching transistor M1 is turned on by the output signal of the shift register unit of the next stage, and the second signal VDS is transmitted to the pull-up node PU, to pull down the pull-up node PU to a low level. Since a phase of a scan signal received by the second clock signal terminal CLKB is the same as a phase of the output signal of the shift register unit of the next stage, which is received by the reset terminal RESET, the third switching transistor M3 is turned on, and the output terminal OUTPUT of the shift register unit is reset.

It should be noted that the structure of the shift register unit that can perform the bidirectional scanning described above in FIG. 2 is merely exemplary and is not intended to limit the present invention.

the shift register circuit can also include:

a first switching unit 101 configured to be turned on in response to a gate drive signal STV, and transmit the gate drive signal STV to an input terminal of a shift register unit of a second stage GOA2;

a second switching unit 102 configured to be turned on in response to an output signal of a shift register unit GOA1 of a first stage, and allow an output terminal OUTPUT of the shift register unit GOA1 of the first stage and the input terminal INPUT of the shift register unit GOA2 of the second stage to be conducted;

a third switching unit 103 configured to be turned on in response to a first signal VSD, and connect a first node N1 with the input terminal INPUT of the shift register unit GOA2 of the second stage;

a fourth switching unit 104 configured to be turned on in response to the gate drive signal STV, and connect the first node N1 with an input terminal INPUT of the shift register unit GOA1 of the first stage;

a fifth switching unit 105 configured to be turned on in response to the gate drive signal STV, and transmit the gate drive signal STV to a reset terminal RESET of a shift register unit GOAN-1 of an N-1$^{th}$ stage;

a sixth switching unit 106 configured to be turned on in response to an output signal of a shift register unit GOAN of an N$^{th}$ stage, and connect an output terminal OUTPUT of the shift register unit GOAN of the N$^{th}$ stage with the reset terminal RESET of the shift register unit GOAN-1 of the N-1$^{th}$ stage;

a seventh switching unit 107 configured to be turned on in response to the second signal VDS, and connect a second node N2 with the reset terminal RESET of the shift register unit GOAN-1 of the N-1$^{th}$ stage; and an eighth switching unit 108 configured to be turned on in response to the gate drive signal STV to connect a reset terminal RESET of the shift register unit GOAN of the N$^{th}$ stage with the second node N2.

It should be noted that a cascading manner from the shift register unit GOA2 of the second stage to the shift register unit GOAN-1 of N-1$^{th}$ stage may be as follows: an output terminal of a shift register unit of a previous stage is connected to an input terminal of a shift register unit of a next stage, and a reset terminal of the shift register unit of the previous stage is connected to an output terminal of the shift register unit of the next stage.

In this exemplary embodiment, the first switching unit 101 may include a first switching element T1, wherein a control terminal and a first terminal of the first switching element T1 receive the gate drive signal STV, and a second terminal of the first switching element T1 is connected to the input terminal of the shift register unit GOA2 of the second stage.

The second switching unit 102 may include a second switching element T2, wherein a control terminal and a second terminal of the second switching element T2 are connected to the output terminal OUTPUT of the shift register unit GOA1 of the first stage, and a first terminal of the second switching element T2 is connected to the input terminal INPUT of the shift register unit GOA2 of the second stage.

The third switching unit 103 may include a third switching element T3, wherein a control terminal of the third switching element T3 receives the first signal VSD, a first terminal of the third switching element T3 is connected to the first node N1, and a second terminal of the third switching element T3 is connected to the input terminal INPUT of the shift register unit GOA2 of the second stage.

The fourth switching unit 104 may include a fourth switching element T4, wherein a control terminal of the fourth switching element T4 receives the gate drive signal STV, and a first terminal of the fourth switching element T4 is connected to the input terminal INPUT of the shift register unit GOA1 of the first stage, and a second terminal of the fourth switching element T4 is connected to the first node N1.

The fifth switching unit 105 may include a fifth switching element T5, wherein a control terminal and a first terminal of the fifth switching element T5 receive the gate drive signal STV, and a second terminal of the fifth switching element T5 is connected to the reset terminal RESET of the shift register unit GOAN-1 of the N-1$^{th}$ stage.

The sixth switching unit 106 may include a sixth switching element T6, wherein a control terminal and a second terminal of the sixth switching element T6 are connected to the output terminal OUTPUT of the shift register unit GOAN of the N$^{th}$ stage, and a first terminal of the sixth switching element T6 is connected to the reset terminal RESET of the shift register unit GOAN-1 of the N-1$^{th}$ stage.

The seventh switching unit 107 may include a seventh switching element T7, wherein a control terminal of the seventh switching element T7 receives the second signal VDS, a first terminal of the seventh switching element T7 is connected to the second node N2, and a second terminal of the seventh switching element T7 is connected to the reset terminal RESET of the shift register unit GOAN-1 of the N-1$^{th}$ stage.

The eighth switching unit 108 may include an eighth switching element T8, wherein a control terminal of the eighth switching element T8 receives the gate drive signal STV, and a first terminal of the eighth switching element T8 is connected to the reset terminal RESET of the shift register unit GOAN of the N$^{th}$ stage, and a second terminal of the eighth switching element T8 is connected to the second node N2.

The first to eighth switching elements (T1 to T8) may respectively correspond to the first to eighth switching transistors, and each of the switching transistors includes a control terminal, a first terminal, and a second terminal. For example, the control terminal of each of the switching transistors may be a gate electrode, the first terminal of each of the switching transistors may be a source electrode, and the second terminal of each of the switching transistors may be a drain electrode. For another example, the control terminal of each of the switching transistors may be a gate electrode, the first terminal of each of the switching transistors may be a drain electrode, and the second terminal of each of the switching transistors may be a source electrode. In addition, the switching transistors may be enhancement type transistors or depletion type transistors, which is not specifically limited by this exemplary embodiment. The switching elements may all be thin film transistors. It should be noted that since the source electrode and the drain electrode of the switching transistor are symmetrical to each other, the source electrodes and the drain electrodes of the first to eighth switching transistors can be interchanged.

On this basis, on the premise that the switching elements are all N-type transistors, when the forward scan is performed on the shift register circuit, the first signal VSD is a low level signal, and the second signal VDS is a high level signal; and when the reverse scan is performed on the shift register circuit, the first signal VSD is a high level signal, and the second signal VDS is a low level signal.

On the premise that the switching elements are all P-type transistors, when the forward scan is performed on the shift register circuit, the first signal VSD is a high level signal, and the second signal VDS is a low level signal; and when the reverse scan is performed on the shift register circuit, the first signal VSD is a low level signal, and the second signal VDS is a high level signal.

It should be noted that the specific structures of the first to eighth switching units 101 to 108 are merely exemplary and are not intended to limit the present invention. For example, the first switching unit 101 may include two first switching elements T1 connected in series. For another example, the second switching unit 102 may include two second switching elements T2 connected in series, which is not specifically limited by this exemplary embodiment.

In summary, the shift register circuit includes the first to eighth switching units. During the forward scan of the shift register circuit, the shift register circuit is controlled to start scanning from the shift register unit of the second stage by the gate drive signal and the first signal by means of the first switching unit and the third switching unit, and a pull-up node in the shift register unit of the N–1$^{th}$ stage is reset by the output signal of the shift register unit of the N$^{th}$ stage by means of the sixth switching unit, to ensure that the pull-up node of the shift register unit of the N–1$^{th}$ stage can be normally reset; and during the reverse scan of the shift register circuit, the shift register circuit is controlled to start scanning from the shift register unit of the N–1$^{th}$ stage by the gate drive signal and the second signal by means of the fifth switching unit and the seventh switching unit, and a pull-up node in the shift register unit of the second stage is reset by the output signal of the shift register unit of the first stage by means of the second switching unit, to ensure that the pull-up node of the shift register unit of the second stage can be normally reset. Obviously, when the forward scan is performed, the shift register circuit starts scanning from the shift register unit of the second stage rather than the shift register unit of the first stage, and when the reverse scan is performed, the shift register circuit starts scanning from the shift register unit of the N–1$^{th}$ stage rather than the shift register unit of the N$^{th}$ stage, moreover, the pull-up node in the shift register unit of the N–1$^{th}$ stage can be normally reset during the forward scan, and the pull-up node of the shift register unit of the second stage can also be normally reset during the reverse scan, in this way, a drift of a threshold voltage of transistors (the driving transistor DT, the fifth switching transistor M5 and the sixth switching transistor M6 as shown in FIG. 2) connected to the pull-up nodes is avoided, and a low output signal of the shift register unit of the second stage and the shift register unit of the N–1$^{th}$ stage is also avoided. Therefore, no matter if it is switched from the forward scan to the reverse scan or from the reverse scan to the forward scan, a normal output signal of the shift register unit of the second stage and the shift register unit of the N–1$^{th}$ stage are ensured, so that a phenomenon in which after a scanning direction is switched, the shift register unit of a certain state cannot reach an enough turn-on voltage and fail to generate an output signal is avoided, and further, display abnormality is avoided. In addition, reliability of the shift register circuit is improved by the first to eighth switching units.

In an exemplary embodiment of the present disclosure, there is also provided a driving method of a shift register circuit for driving the shift register circuit as described in FIG. 1. The driving method of the shift register circuit may include:

When the forward scan is performed, the first switching unit 101 is turned on by a gate drive signal STV, to transmit the gate drive signal STV to the input terminal INPUT of the shift register unit GOA2 of the second stage to enable the shift register circuit to start performing the forward scan from the shift register unit GOA2 of the second stage, and meanwhile, the fifth switching unit 105 and the eighth switching unit 108 are turned on by the gate drive signal STV, and the seventh switching unit 107 is turned on by a second signal VDS to transmit the gate drive signal STV to the reset terminal RESET of the shift register unit GOAN of the N$^{th}$ stage and the reset terminal RESET of the shift register unit GOAN-1 of the N–1$^{th}$ stage, and when scanning to the shift register unit GOAN of the N$^{th}$ stage, the sixth switching unit 106 is turned on by the output signal of the shift register unit GOAN of the N$^{th}$ stage, to transmit the output signal to the reset terminal of the shift register unit GOAN-1 of the N–1$^{th}$ stage. In the present exemplary embodiment, the first switching unit 101, the fourth switching unit 104, the fifth switching unit 105, and the eighth switching unit 108 are turned on by the gate drive signal STV, and the third switching unit 103 is turned off by the first signal VSD, and the seventh switching unit 107 is turned on by the second signal VDS, in this case, the gate drive signal STV is transmitted to the input terminal INPUT of the shift register unit GOA2 of the second stage through the first switching unit 101 to enable the shift register circuit to start scanning from the shift register unit GOA2 of the second stage to the shift register unit GOAN of the N$^{th}$ stage, and the gate drive signal STV is transmitted to the reset terminal RESET of the shift register unit GOAN-1 of the N–1$^{th}$ stage through the fifth switching unit 105, the gate drive signal STV is transmitted to the reset terminal GOA of the shift register unit GOAN of the N$^{th}$ stage through the fifth switching unit 105, the seventh switching unit 107, and the eighth switching unit 108 to reset the pull-up nodes in the shift register unit GOAN-1 of the N–1$^{th}$ stage and the shift register unit GOAN of the N$^{th}$ stage. When scanning to the shift register unit GOAN of the N$^{th}$ stage, the output signal of the output terminal of the shift register unit GOAN of the N$^{th}$ stage turns on the sixth switching unit 106 to reset the pull-up node in the shift register unit GOAN-1 of the N–1$^{th}$ stage.

When the forward scan is switched to the reverse scan, the first signal VSD and the second signal VDS are interchanged to interchange the reset terminal RESET and the input terminal INPUT of each of the shift register units, and the first clock signal CLK1 and the second clock signal CLK2 are switched, the fifth switching unit 105 is turned on by the gate drive signal STV, to transmit the gate drive signal STV to the input terminal of the shift register unit GOAN-1 of the N–1$^{th}$ stage (i.e., the reset terminal RESET of the shift register unit GOAN-1 of the N–1$^{th}$ stage in FIG. 1) to enable the shift register circuit to start performing the reverse scan from the shift register unit GOAN-1 of the N–1$^{th}$ stage, and meanwhile, the first switching unit 101 and the fourth switching unit 104 are turned on by the gate drive signal STV, and the third switching unit 103 is turned on by the first signal VSD, to transmit the gate drive signal STV to the reset terminals of the shift register unit GOA1 of the first stage and the shift register unit GOA2 of the second stage (i.e., the input terminals INPUT of the shift register unit GOA1 of the first stage and the shift register unit GOA2 of the second stage in FIG. 1), and when scanning to the shift register unit GOA1 of the first stage, the second switching unit 102 is turned on by the output signal of the shift register unit GOA1 of the first stage, to transmit the output signal to the reset terminal of the shift register unit GOA2 of the second stage (i.e., the input terminal INPUT of the shift register unit GOA2 of the second stage in FIG. 1). In the present exemplary embodiment, the fifth switching unit 105, the eighth switching unit 108, the first switching unit 101, and the fourth switching unit 104 is turned on by the gate drive signal STV, and the third switching unit 103 is turned on by the first signal VSD, and the seventh switching unit 107 is turned off by the second signal VDS. In this case, the gate drive signal STV is transmitted to the input terminal of the shift register unit GOAN-1 of the N–1$^{th}$ stage through the fifth switching unit 105 (i.e., the reset terminal RESET of the shift register unit GOAN-1 of the N–1$^{th}$ in FIG. 1), meanwhile, the gate drive signal STV is transmitted to the reset terminal of the shift register unit GOA2 of the second stage (i.e., the input terminal INPUT of the shift register unit GOA2 of the second stage in FIG. 1) through the first switching unit 101, the gate drive signal STV is transmitted to the reset terminal of the shift register unit GOA1 of the first stage (i.e., the input terminal INPUT of the shift register unit GOA1 of the first stage in FIG. 1) through the first switching unit 101, the third switching unit 103, and the fourth switching unit 104. When scanning to the shift register unit GOA1 of the first stage, the second switching unit 102 is turned on by the output signal of the output terminal of the shift register unit GOA1 of the first stage to reset the pull-up node in the shift register unit GOA2 of the second stage.

It can be seen from the above that during the forward scan of the shift register circuit, the shift register circuit is controlled to start scanning from the shift register unit GOA2 of the second stage by the gate drive signal STV, the first signal VSD by means of the first switching unit 101 and the third switching unit 103, and the pull-up node in the shift register unit GOAN-1 of the N–1$^{th}$ stage is reset by the output signal of the shift register unit GOAN of the N$^{th}$ stage by means of the sixth switching unit 106, so as to ensure the normal reset of the pull-up node in the shift register unit GOAN-1 of the N–1$^{th}$ stage; and during the reverse scan of the shift register circuit, the shift register circuit is controlled to start scanning from the shift register unit GOAN-1 of the N–1$^{th}$ stage by the gate drive signal STV, the second signal VDS by means of the fifth switching unit 105 and the seventh switching unit 107, and the pull-up node in the shift register unit GOA2 of the second stage by the output signal of the shift register unit GOA1 of the first stage by means of the second switching unit 102, to ensure the normal reset of the pull-up node in the shift register unit GOA2 of the second stage. Obviously, when the forward scan is performed, the shift register circuit starts scanning from the shift register unit GOA2 of the second stage rather than the shift register unit GOA1 of the first stage, and when the reverse scan is performed, the shift register circuit starts scanning from the shift register unit GOAN-1 of the N–1$^{th}$ stage rather than the shift register unit GOAN of the N$^{th}$ stage, moreover, the pull-up node in the shift register unit GOAN-1 of the N–1$^{th}$ stage can be normally reset during the forward scan, and the pull-up node in the shift register unit GOA2 of the second stage can also be normally reset during the reverse scan, in this way, a drift of a threshold voltage of transistors (the driving transistor DT, the fifth switching transistor M5 and the sixth switching transistor M6 as shown in FIG. 2) connected to the pull-up nodes is avoided, and a low output signal of the shift register unit of the second stage and the shift register unit of the N–1$^{th}$ stage is also avoided, therefore, no matter it is switched from the forward scan to the reverse scan or from the reverse scan to the forward scan, a normal output signal of the shift register unit GOA2 of the second stage and the shift register unit GOAN-1 of the N–1$^{th}$ stage are ensured, so that a phenomenon in which after a scanning direction is switched, the shift register unit of a certain state cannot reach an enough turn-on voltage and fail to generate an output signal is avoided, and further, display abnormality is avoided; in addition, reliability of the shift register circuit is improved by the first to eighth switching units.

Further, as shown in FIG. 1, the first to eighth switching units 101 to 108 correspond to the first to eighth switching elements T1 to T8, respectively. The first to eighth switching elements T1 to T8 may respectively correspond to the first to eighth switching transistors, and each of the switching transistors includes a control terminal, a first terminal, and a second terminal. For example, the control terminal of each of the switching transistors may be a gate electrode, the first terminal of each of the switching transistors may be a source electrode, and the second terminal of each of the switching transistors may be a drain electrode. For another example, the control terminal of each of the switching transistors may be a gate electrode, the first terminal of each of the switching transistors may be a drain electrode, and the second terminal of each of the switching transistors may be a source electrode. In addition, the switching transistors may be enhancement type transistors or depletion type transistors, which is not specifically limited by this exemplary embodiment. The switching elements may all be thin film transistors. It should be noted that since the source electrode and the drain electrode of the switching transistor are symmetrical to each other, the source electrodes and the drain electrodes of the first to eighth switching transistors can be interchanged.

Figure 3:
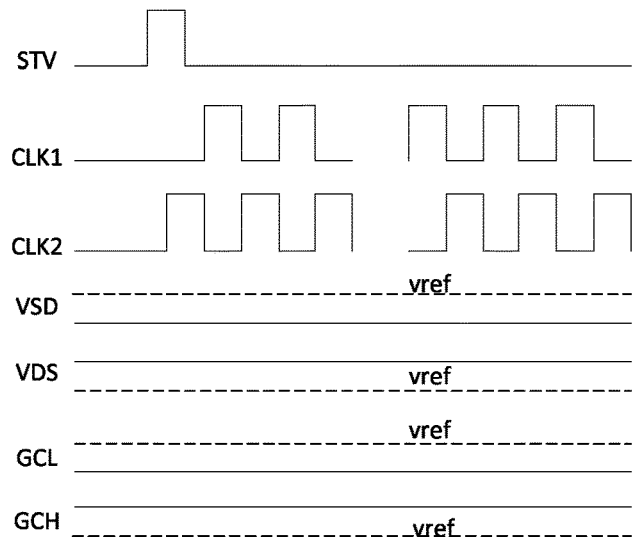
FIG. 3 is a sequence diagram of forward scan provided in an exemplary embodiment of the present disclosure.

In the following, on the basis that the first switching unit 101 to the eighth switching unit 108 correspond to the first switching element T1 to the eighth switching element T8, respectively, an operating process of the shift register circuit of FIG. 1 will be described with reference to an operation sequence diagram of the forward scan of the shift register circuit shown in FIG. 3 and an operation sequence diagram of the reverse scan of the shift register circuit shown in FIG. 4. An example is taken in which the switching elements are all N-type transistors. Since the switching elements are all N-type transistors, a level, at which the switching elements are turned on, is only a high level. The operation sequence diagram in FIG. 3 illustrates the gate drive signal STV, the first clock signal CLK1, the second clock signal CLK2, the first signal VSD, the second signal VDS, the first reference signal GCL, and the second reference signal GCH when the forward scan is performed. The operation sequence diagram in FIG. 4 illustrates the gate drive signal STV, the first clock signal CLK1, the second clock signal CLK2, the first signal VSD, the second signal VDS, the first reference signal GCL, and the second reference signal GCH when the reverse scan is performed.

Figure 4:
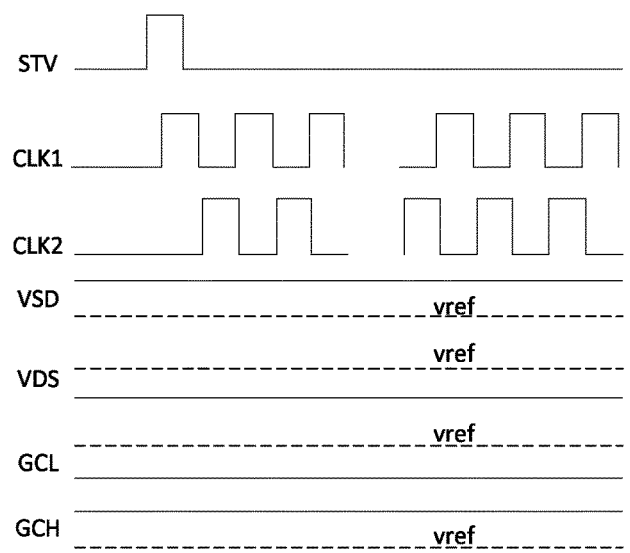
FIG. 4 is a sequence diagram of reverse scan provided in an exemplary embodiment of the present disclosure.

It shall be noted that a signal higher than a reference signal vref indicated by a broken line in FIGS. 3 and 4 is a high level signal, and a signal lower than the reference signal vref indicated by the broken line is a low level signal.

As shown in FIG. 3, when the forward scan is performed, the first signal VSD is a low level signal, and the second signal VDS is a high level signal. When the gate drive signal STV transitions to a high level, the first switching element T1, the fourth switching element T4, the fifth switching element T5, and the eighth switching element T8 are turned on. Since the first signal VSD is a low level signal, the third switching element T3 is turned off. Since the second signal VDS is a high level signal, the seventh switching element T7 is turned on. The gate drive signal STV is transmitted to the input terminal INPUT of the shift register unit GOA2 of the second stage through the first switching element T1 to enable the shift register circuit to start performing the forward scan from the shift register unit GOA2 of the second stage. At the same time, the gate drive signal STV is transmitted to the reset terminal RESET of the shift register unit GOAN-1 of the N–1$^{th}$ stage through the fifth switching element T5, and the gate drive signal STV is transmitted to the reset terminal RESET of the shift register unit GOAN of the N$^{th}$ stage through the fifth switching element T5, the seventh switching element T7, and the eighth switching element T8 to reset the pull-up nodes in the shift register unit GOAN-1 of the N–1$^{th}$ stage and the shift register unit GOAN of the N$^{th}$.

When forward scanning to the shift register unit GOAN of the N$^{th}$ stage, the sixth switching element T6 is turned on by the output signal outputted from the output terminal OUTPUT of the shift register unit GOAN of the N$^{th}$ stage, to transmit the output signal to the reset terminal RESET of the shift register unit GOAN-1 of the N–1$^{th}$ stage through the sixth switching element T6, to reset the pull-up node in the shift register unit GOAN-1 of the N–1$^{th}$ stage, which ensures the normal reset of the pull-up node in the shift register unit GOAN-1 of the N–1$^{th}$ stage, and avoids a shift of a threshold voltage of a transistor connected to the pull-up node in the shift register unit GOAN-1 of the N–1$^{th}$ stage, and further ensures a normal output signal of the shift register unit GOAN-1 of the N–1$^{th}$ stage. The pull-up node in the shift register unit GOAN of the N$^{th}$ stage will be reset by a gate drive signal STV in a next frame.

When the forward scan is switched to the reverse scan, as shown in FIG. 4, the first signal VSD and the second signal VDS are interchanged, that is, the first signal VSD is a high level signal, and the second signal VDS is a low level signal, to interchange the reset terminal and the input terminal of each of the shift register units, that is, the reset terminal of the shift register unit is switched to the input terminal, and the input terminal of the shift register unit is switched to the reset terminal. At the same time, the first clock signal CLK1 and the second clock signal CLK2 are switched, that is, a sequence diagram of the current second clock signal CKL2 is the same as a sequence diagram of the first clock signal CLK1 during the forward scan, and a sequence diagram of the current first clock signal CLK1 is the same as a sequence diagram of the second clock signal CLK2 during the forward scan.

During the reverse scan, when the gate drive signal STV transitions to a high level, the first switching element T1, the fourth switching element T4, the fifth switching element T5, and the eighth switching element T8 are turned on. Since the first signal VSD is a high level signal, the third switching element T3 is turned on. Since the second signal VDS is a low level signal, the seventh switching element T7 is turned off. The gate drive signal STV is transmitted to the input terminal of the shift register unit GOAN-1 of the N–1$^{th}$ stage (i.e., the reset terminal RESET of the shift register unit GOAN-1 of the N–1$^{th}$ stage in FIG. 1) through the fifth switching element T5, to enable the shift register circuit to start performing the reverse scan from the shift register unit GOAN-1 of the N–1$^{th}$ stage, and at the same time, the gate drive signal STV is transmitted to the reset terminal of the shift register unit GOA2 of the second stage (i.e., the input terminal INPUT of the shift register unit GOA2 of the second stage in FIG. 1) through the first switching element T1, and the gate drive signal STV is transmitted to the reset terminal of the shift register unit GOA1 of the first stage (i.e., the input terminal INPUT of the shift register unit GOA1 of the first stage in FIG. 1) through the first switching element T1, the third switching element T3, and the fourth switching element T4, to reset the pull-up nodes in the shift register unit GOA1 of the first stage and the shift register unit GOA2 of the second stage.

When reverse scanning to the shift register unit GOA1 of the first stage, the second switching element T2 is turned on by the output signal outputted from the output terminal of the shift register unit GOA1 of the first stage, and the output signal is transmitted to the reset terminal of the shift register unit GOA2 of the second stage (i.e., the input terminal INPUT of the shift register unit GOA2 of the second stage in FIG. 1) through the second switching element T2, to reset the pull-up node in the shift register unit GOA2 of the second stage, which ensures the normal reset of the pull-up node in the shift register unit GOA2 of the second-stage, and avoids a shift of a threshold voltage of the transistors connected to the pull-up node in the shift register unit GOA2 of the second-stage, and further ensures a normal output signal of the shift register unit GOA2 of the second-stage. The pull-up node in the shift register unit GOA1 of the first stage is reset by a gate drive signal STV in a next frame.

During the forward scan of the shift register circuit, the shift register circuit is controlled to start scanning from the shift register unit GOA2 of the second stage by the gate drive signal STV, the first signal VSD by means of the first switching element T1 and the third switching element T3, and the pull-up node in the shift register unit GOAN-1 of the N–1$^{th}$ stage is reset by the output signal of the shift register unit GOAN of the N$^{th}$ stage by means of the sixth switching element T6, to ensure the normal reset of the pull-up node in the shift register unit GOAN-1 of the N–1$^{th}$ stage, and during the reverse scan of the shift register circuit, the shift register circuit is controlled to start scanning from the shift register unit GOAN-1 of the N–1$^{th}$ stage by the gate drive signal STV, the second signal VDS by means of the fifth switching element T5 and the seventh switching element T7, and the pull-up node in the shift register unit GOA2 of the second stage is reset by the output signal of the shift register unit GOA1 of the first stage by means of the second switching element T2, to ensure the normal reset of the pull-up node in the shift register unit GOA2 of the second stage. Obviously, when the forward scan is performed, the shift register circuit starts scanning from the shift register unit GOA2 of the second stage rather than the shift register unit GOA1 of the first stage, and when the reverse scan is performed, the shift register circuit starts scanning from the shift register unit GOAN-1 of the N–1$^{th}$ stage rather than the shift register unit GOAN of the N$^{th}$ stage, moreover, the pull-up node in the shift register unit GOAN-1 of the N–1$^{th}$ stage can be normally reset during the forward scan, and the pull-up node in the shift register unit GOA2 of the second stage can also be normally reset during the reverse scan, in this way, a drift of a threshold voltage of transistors (the driving transistor DT, the fifth switching transistor M5 and the sixth switching transistor M6 as shown in FIG. 2) connected to the pull-up nodes is avoided, and a low output signal of the shift register unit of the second stage and the shift register unit of the N-1$^{th}$ stage is also avoided, therefore, no matter if it is switched from the forward scan to the reverse scan or from the reverse scan to the forward scan, a normal output signal of the shift register unit GOA2 of the second stage and the shift register unit GOAN-1 of the N-1$^{th}$ stage are ensured, so that a phenomenon in which after a scanning direction is switched, the shift register unit of a certain state cannot reach a sufficient turn-on voltage and fail to generate an output signal is avoided, and further, display abnormality is avoided. In addition, reliability of the shift register circuit is improved by the first to eighth switching units.

It shall be noted that in the foregoing embodiments, all of the switching elements are N-type transistors, but those skilled in the art can easily derive a shift register circuit in which all of the switching elements are P-type transistors according to the shift register circuit provided by the present disclosure. Since all of the switching elements are P-type transistors, a signal, by which all of the switching elements are turned on, is at a low level. On the premise that the switching elements are all P-type transistors, when the forward scan is performed, the first signal is a high level signal, and the second signal is a low level signal, and when the reverse scan is performed, the first signal is a low level signal, and the second signal is a high level signal. The use of the P-type transistors has the following advantages, for example, such as, strong noise suppression, low turn-on level and easy implementation of low level in charge management, simple manufacturing process and relatively low price, and better stability and so on.

Of course, the shift register provided by the present disclosure may also be changed to a Complementary Metal Oxide Semiconductor (CMOS) circuit or the like, and is not limited to the shift register circuit provided by this embodiment, and details will not be described herein again.

In the above shift register circuit, only two clock signals (i.e., a first clock signal and a second clock signal) are included. In the existing shift register circuit, however, the number of clock signals may be 2M, wherein M is an integer greater than zero, for example, the number of the clock signals may be two, four, or six, etc., which is not particularly limited by this exemplary embodiment.

When the shift register circuit including 2M clock signals includes N shift register units, the connection manner of the shift register units in the shift register circuit including 2M clock signals is: an output terminal of a shift register unit of an N$^{th}$ stage is connected to an input terminal of a shift register unit of an N+M$^{th}$ stage, and a reset terminal of the shift register unit of the N$^{th}$ stage is connected to an output terminal of the shift register unit of the N+M$^{th}$ stage. Obviously, from the above connection relationship, the shift register circuit including 2M clock signals can be divided into M shift register circuits including two clock signals. By separately configuring the M shift register circuits including two clock signals to the shift register circuit as shown in FIG. 1, it is ensured that the shift register circuit including 2M clock signals operates normally.

For example, in a shift register circuit in which M is equal to 2 and N is equal to 10, that is, a shift register circuit including four clock signals and including shift register units of ten stages, it can be seen from the above-described connection relationship that the shift register circuit composed of the shift register units of an odd-numbered stage (i.e., the shift register units of the first stage, the third stage, the fifth stage, the seventh stage, and the ninth stage) is the first shift register circuit including two clock signals, and the shift register circuit composed of the shift register units of an even-numbered stage (the shift register units of the second stage, the fourth stage, the sixth stage, the eighth stage, and the tenth stage) is the second shift register circuit including two clock signals. For the first shift register circuit, the connection manner of the shift register unit of the first stage and the shift register unit of the third stage is configured as the connection manner of the shift register unit of the first stage and the shift register unit of the second stage as shown in FIG. 1, and the connection manner of the shift register unit of the seventh stage and the shift register unit of the ninth stage is configured as the connection manner of the shift register unit of the N-1$^{th}$ stage and the shift register unit of the N$^{th}$ stage as shown in FIG. 1. In this way, the normal output of the first shift register circuit is ensured. Similarly, for the second shift register circuit, the connection manner of the shift register unit of the second stage and the shift register unit of the fourth stage is configured as the connection manner of the shift register unit of the first stage and the shift register unit of the second stage as shown in FIG. 1, and the connection manner of the shift register unit of the eighth stage and the shift register unit of the tenth stage is configured as the connection manner of the shift register unit of the N-1$^{th}$ stage and the shift register unit of the N$^{th}$ stage as shown in FIG. 1. In this way, the normal output of the second shift register circuit is ensured, thereby, the normal output of the shift register circuit including the four clock signals and including the shift register units of ten stages is ensured.

The present exemplary embodiment also provides a display device including the above-described shift register circuit. In the present exemplary embodiment, for example, the display device may include any product or component having a display function, such as a mobile phone, a tablet computer, a television, a notebook computer, a digital photo frame, a navigator, and the like.

It should be noted that although several modules or units of a device for carrying actions are mentioned in the detailed descriptions above, such division is not mandatory. In fact, features and functions of two or more of the modules or units described above may be embodied in one module or unit in accordance with the embodiments of the present disclosure. Conversely, the features and functions of one module or unit described above may be further embodied by multiple modules or units.

In addition, although the various steps of the method of the present disclosure are described in a particular order in the figures, it is not required or implied that the steps must be performed in the particular order, or all the illustrated steps must be performed to achieve the desired result. Additionally or alternatively, some steps may be omitted, or multiple steps may be combined into one step to be performed, and/or one step is decomposed into multiple steps to be performed.

Other embodiments of the present disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and embodiments be considered as exemplary only, with a true scope and spirit of the present disclosure being indicated by the following claims.

What is claimed is:

1. A shift register circuit, comprising N cascaded shift register units, wherein the shift register units of odd-numbered stages receive a first clock signal, and the shift register units of even-numbered stages receive a second clock signal, N is an integer and N≥4, wherein the shift register circuit further comprises:
- a first switching unit configured to be turned on in response to a gate drive signal, to transmit the gate drive signal to an input terminal of the shift register unit of the second stage;
- a second switching unit configured to be turned on in response to an output signal of the shift register unit of the first stage, to connect an output terminal of the shift register unit of the first stage with the input terminal of the shift register unit of the second stage;
- a third switching unit configured to be turned on in response to a first signal, to connect a first node with the input terminal of the shift register unit of the second stage;
- a fourth switching unit configured to be turned on in response to the gate drive signal, to connect the first node with an input terminal of the shift register unit of the first stage;
- a fifth switching unit configured to be turned on in response to the gate drive signal, to transmit the gate drive signal with a reset terminal of the shift register unit of the $N-1^{th}$ stage;
- a sixth switching unit configured to be turned on in response to an output signal of the shift register unit of the $N^{th}$ stage, to connect an output terminal of the shift register unit of the $N^{th}$ stage with the reset terminal of the shift register unit of the $N-1^{th}$ stage;
- a seventh switching unit configured to be turned on in response to a second signal, to connect a second node to the reset terminal of the shift register unit of the $N-1^{th}$ stage; and
- an eighth switching unit configured to be turned on in response to the gate drive signal, to connect a reset terminal of the shift register unit of the $N^{th}$ stage with the second node.

2. The shift register circuit according to claim 1, wherein the first switching unit comprises:
- a first switching element having a control terminal and a first terminal which receive the gate drive signal, and a second terminal which is connected to the input terminal of the shift register unit of the second stage;

the second switching unit comprises:
- a second switching element having a control terminal and a second terminal which are connected to the output terminal of the shift register unit of the first stage, and a first terminal which is connected to the input terminal of the shift register unit of the second stage;

the third switching unit comprises:
- a third switching element having a control terminal which receives the first signal, a first terminal which is connected to the first node, and a second terminal which is connected to the input terminal of the shift register unit of the second stage;

the fourth switching unit comprises:
- a fourth switching element having a control terminal which receives the gate drive signal, a first terminal which is connected to the input terminal of the shift register unit of the first stage, and a second terminal which is connected to the first node;

the fifth switching unit comprises:
- a fifth switching element having a control terminal and a first terminal which receive the gate drive signal, and a second terminal which is connected to the reset terminal of the shift register unit of the $N-1^{th}$ stage;

the sixth switching unit comprises:
- a sixth switching element having a control terminal and a second terminal which are connected to the output terminal of the shift register unit of the $N^{th}$ stage, and a first terminal which is connected to the reset terminal of the shift register unit of the $N-1^{th}$ stage;

the seventh switching unit comprises:
- a seventh switching element having a control terminal which receives the second signal, a first terminal which is connected to the second node, and a second terminal which is connected to the reset terminal of the shift register unit of the $N-1^{th}$ stage; and the eighth switching unit comprises:
- an eighth switching element having a control terminal which receives the gate drive signal, a first terminal which is connected to the reset terminal of the shift register unit of the $N^{th}$ stage, and a second terminal which is connected to the second node.

3. The shift register circuit according to claim 2, wherein the switching elements are all N-type transistors, and when a forward scan is performed on the shift register circuit, the first signal is a low level signal, and the second signal is a high level signal, and when a reverse scan is performed on the shift register circuit, the first signal is a high level signal, and the second signal is a low level signal.

4. The shift register circuit according to claim 2, wherein the switching elements are all P-type transistors;
when a forward scan is performed on the shift register circuit, the first signal is a high level signal and the second signal is a low level signal; and
when a reverse scan is performed on the shift register circuit, the first signal is a low level signal and the second signal is a high level signal.

5. The shift register circuit according to claim 2, wherein the switching elements are all thin film transistors.

6. The shift register circuit according to claim 3, wherein the switching elements are all thin film transistors.

7. The shift register circuit according to claim 4, wherein the switching elements are all thin film transistors.

8. A driving method of a shift register circuit comprising N cascaded shift register units, wherein the shift register units of odd-numbered stages receive a first clock signal, and the shift register units of even-numbered stages receive a second clock signal, N is an integer and N≥4, wherein the shift register circuit further comprises:
- a first switching unit configured to be turned on in response to a gate drive signal and to transmit the gate drive signal to an input terminal of the shift register unit of the second stage;
- a second switching unit configured to be turned on in response to an output signal of the shift register unit of the first stage and to connect an output terminal of the shift register unit of the first stage with the input terminal of the shift register unit of the second stage;
- a third switching unit configured to be turned on in response to a first signal and to connect a first node with the input terminal of the shift register unit of the second stage;
- a fourth switching unit configured to be turned on in response to the gate drive signal and to connect the first node with an input terminal of the shift register unit of the first stage;
- a fifth switching unit configured to be turned on in response to the gate drive signal and to transmit the gate drive signal with a reset terminal of the shift register unit of the $N-1^{th}$ stage;

a sixth switching unit configured to be turned on in response to an output signal of the shift register unit of the $N^{th}$ stage and to connect an output terminal of the shift register unit of the $N^{th}$ stage with the reset terminal of the shift register unit of the $N-1^{th}$ stage;

a seventh switching unit configured to be turned on in response to a second signal and to connect a second node to the reset terminal of the shift register unit of the $N-1^{th}$ stage;

an eighth switching unit configured to be turned on in response to the gate drive signal and to connect a reset terminal of the shift register unit of the $N^{th}$ stage with the second node;

wherein the driving method comprises:

performing a forward scan, where the first switching unit is turned on by the gate drive signal, to transmit the gate drive signal to the input terminal of the shift register unit of the second stage, so that the shift register circuit starts performing the forward scan from the shift register unit of the second stage, and at the same time, the fifth switching unit and the eighth switching unit are turned on by the gate drive signal, and the seventh switching unit is turned on by the second signal, to transmit the gate drive signal to the reset terminal of the shift register unit of the $N^{th}$ stage and the reset terminal of the shift register unit of the $N-1^{th}$ stage, when scanning to the shift register unit of the $N^{th}$ stage, the sixth switching unit is turned on by the output signal of the shift register unit of the $N^{th}$ stage, to transmit the output signal to the reset terminal of the shift register unit of the $N-1^{th}$ stage; and switching the forward scan to a reverse scan, where the first signal and the second signal are interchanged to interchange the reset terminals and the input terminals of the shift register units, and switch the first clock signal and the second clock signal, the fifth switching unit is turned on by the gate drive signal, to transmit the gate drive signal to the input terminal of the shift register unit of the $N-1^{th}$ stage, so that the shift register circuit starts performing the reverse scan from the shift register unit of the $N-1^{th}$ stage, and at the same time, the first switching unit and the fourth switching unit are turned on by the gate drive signal, the third switching unit is turned on by the first signal, to transmit the gate drive signal to the reset terminal of the shift register unit of the first stage and the reset terminal of the shift register unit of the second stage, when scanning to the shift register unit of the first stage, the second switching unit is turned on by the output signal of the shift register unit of the first stage, to transmit the output signal to the reset terminal of the shift register unit of the second stage.

9. The driving method of a shift register circuit according to claim 8, wherein the first switching unit to the eighth switching unit correspond to first switching element to eighth switching element, respectively.

10. The driving method of a shift register circuit according to claim 9, wherein the switching elements are all N-type transistors, and during the performance of the forward scan is, the first signal is a low level signal, and the second signal is a high level signal, and during the performance of the reverse scan is, the first signal is a high level signal, and the second signal is a low level signal.

11. The driving method of a shift register circuit according to claim 9, wherein the switching elements are all P-type transistors, and during the performance of the forward scan is, the first signal is a high level signal, and the second signal is a low level signal, and during the performance of the reverse scan is, the first signal is a low level signal, and the second signal is a high level signal.

12. A display device comprising the shift register circuit according to claim 1.

13. The display device according to claim 12, wherein the first switching unit comprises:

a first switching element having a control terminal and a first terminal which receive the gate drive signal, and a second terminal which is connected to the input terminal of the shift register unit of the second stage;

the second switching unit comprises:

a second switching element having a control terminal and a second terminal which are connected to the output terminal of the shift register unit of the first stage, and a first terminal which is connected to the input terminal of the shift register unit of the second stage;

the third switching unit comprises:

a third switching element having a control terminal which receives the first signal, a first terminal which is connected to the first node, and a second terminal which is connected to the input terminal of the shift register unit of the second stage;

the fourth switching unit comprises:

a fourth switching element having a control terminal which receives the gate drive signal, a first terminal which is connected to the input terminal of the shift register unit of the first stage, and a second terminal which is connected to the first node;

the fifth switching unit comprises:

a fifth switching element having a control terminal and a first terminal which receive the gate drive signal, and a second terminal which is connected to the reset terminal of the shift register unit of the $N-1^{th}$ stage;

the sixth switching unit comprises:

a sixth switching element having a control terminal and a second terminal which are connected to the output terminal of the shift register unit of the $N^{th}$ stage, and a first terminal which is connected to the reset terminal of the shift register unit of the $N-1^{th}$ stage;

the seventh switching unit comprises:

a seventh switching element having a control terminal which receives the second signal, a first terminal which is connected to the second node, and a second terminal which is connected to the reset terminal of the shift register unit of the $N-1^{th}$ stage; and the eighth switching unit comprises:

an eighth switching element having a control terminal which receives the gate drive signal, a first terminal which is connected to the reset terminal of the shift register unit of the $N^{th}$ stage, and a second terminal which is connected to the second node.

14. The display device according to claim 13, wherein the switching elements are all N-type transistors, and the shift register circuit is configured so that during a forward scan, the first signal is a low level signal, and the second signal is a high level signal, and shift register circuit is configured so that during a reverse scan, the first signal is a high level signal, and the second signal is a low level signal.

15. The display device according to claim 13, wherein the switching elements are all P-type transistors, and the shift register circuit is configured so that during a forward scan, the first signal is a high level signal, and the second signal is a low level signal, and the shift register circuit is configured so that during a reverse scan, the first signal is a low level signal, and the second signal is a high level signal.

* * * * *